(12) United States Patent
Terzioglu et al.

(10) Patent No.: US 7,903,497 B2
(45) Date of Patent: Mar. 8, 2011

(54) MULTI-PORT SRAM IMPLEMENTED WITH SINGLE-PORT 6-TRANSISTOR MEMORY CELLS COUPLED TO AN INPUT MULTIPLEXER AND AN OUTPUT DEMULTIPLEXER

(75) Inventors: Esin Terzioglu, Aliso Viejo, CA (US); Gil I. Winograd, Aliso Viejo, CA (US); Andreas Gotterba, Aliso Viejo, CA (US)

(73) Assignee: Novelics, LLC, Aliso Viejo, CA (US)

( * ) Notice: Subject to any disclaimer, the term of this patent is extended or adjusted under 35 U.S.C. 154(b) by 0 days.

(21) Appl. No.: 12/258,231

(22) Filed: Oct. 24, 2008

(65) Prior Publication Data

US 2009/0190389 A1 Jul. 30, 2009

Related U.S. Application Data

(60) Provisional application No. 60/982,219, filed on Oct. 24, 2007.

(51) Int. Cl.
*G11C 8/16* (2006.01)
(52) U.S. Cl. ......... 365/230.05; 365/189.02; 365/189.14; 365/189.05; 365/156
(58) Field of Classification Search .................. 365/156, 365/154, 230.05, 189.02, 189.14, 189.05
See application file for complete search history.

(56) References Cited

U.S. PATENT DOCUMENTS

| 4,878,198 | A | 10/1989 | Roy |
| 5,519,872 | A * | 5/1996 | Khandekar et al. ........... 711/219 |
| 5,812,490 | A | 9/1998 | Tsukude |
| 6,314,489 | B1 | 11/2001 | Nichols et al. |
| 6,728,130 | B1 * | 4/2004 | Afghahi et al. ............... 365/156 |
| 6,873,553 | B1 * | 3/2005 | Afghahi et al. .......... 365/189.07 |
| 6,963,517 | B2 | 11/2005 | Chen |
| 7,518,947 | B2 | 4/2009 | Starnes |
| 2009/0109772 | A1 | 4/2009 | Terzioglu et al. |
| 2009/0190389 | A1 * | 7/2009 | Terzioglu et al. ............. 365/154 |

* cited by examiner

*Primary Examiner* — Andrew Q Tran
(74) *Attorney, Agent, or Firm* — Haynes and Boone, LLP

(57) ABSTRACT

In one embodiment, a multi-port SRAM is provided that comprises: a single input port and output port 6-T SRAM; and a multi-port control block circuit that includes: a plurality of input registers corresponding to a plurality of input ports to register corresponding input signals; an input multiplexer to select from the input registers to provide a selected input signal to the 6-T SRAM's single input port; a plurality of output registers corresponding to a plurality of output ports to register corresponding output signals; and an output de-multiplexer to select from the output registers to provide an output signal from the 6-T SRAM's single output port to the selected output register.

16 Claims, 2 Drawing Sheets

MULTI-PORT SRAM IMPLEMENTED WITH SINGLE-PORT 6-TRANSISTOR MEMORY CELLS COUPLED TO AN INPUT MULTIPLEXER AND AN OUTPUT DEMULTIPLEXER

RELATED APPLICATION

This application claims the benefit of U.S. Provisional Application No. 60/982,219, filed Oct. 24, 2007, the contents of which are hereby incorporated by reference.

FIELD OF THE INVENTION

The present invention relates to memories, and more particularly to a multi-port static random access memory (SRAM) that uses a conventional six-transistor memory cell.

BACKGROUND OF THE INVENTION

Static random access memory (SRAM) memory cells retain their memory states as long as power is supplied to the memory cells. A conventional SRAM memory cell for a single-port memory includes a pair of cross-coupled inverters and corresponding pair of access transistors. Because an inverter requires at least two transistors (a serial stack of a PMOS transistor and an NMOS transistor), a conventional SRAM single-port memory cell uses six transistors.

In contrast, a dynamic random access memory (DRAM) uses a one-transistor memory cells such that a DRAM offers considerable density advantages and is thus cheaper than SRAM. But the cross-coupled inverters in an SRAM drive the stored memory content onto the bit lines whereas a DRAM has no such active drive. Thus, SRAM is typically much faster than DRAM such that SRAM is reserved for time-critical operations such as memory caches.

The greater cost of SRAM is exacerbated in multi-port applications because each additional port is conventionally accommodated at the memory cell level by an additional pair of access transistors. Thus, a conventional dual-port memory cell requires eight transistors, a three-port memory cell requires ten transistors, and so on. These additional transistor demand die space and increase the resulting cost of the SRAM.

Accordingly, there is a need in the art for multi-port SRAMs with enhanced densities.

SUMMARY OF THE INVENTION

A multi-port SRAM that uses a smaller 6-transistor (6-T) cell instead of the larger 8-T cell conventionally used for multi-port SRAM is provided. According to one aspect of the invention, the multi-port SRAM comprises: a single input port and single output port 6-T SRAM; and a multi-port control block circuit that includes: a plurality of input registers corresponding to a plurality of input ports to register corresponding input signals; an input multiplexer to select from the input registers to provide a selected input signal to the 6-T SRAM's single input port; a plurality of output registers corresponding to a plurality of output ports to register corresponding output signals; and an output de-multiplexer to select from the output registers to provide an output signal from the 6-T SRAM's single output port to the selected output register. Because such a multi-port SRAM uses a 6-T memory cell, it has significant size and speed advantages over a traditional 8-T memory cell approach.

Further limitations and disadvantages of conventional and traditional approaches will become apparent to one of skill in the art, through comparison of such systems with the present invention as set forth in the remainder of the present application with reference to the drawings.

BRIEF DESCRIPTION OF THE FIGURES

To allow cross-referencing among the figures, like elements in the figures are provided like reference numerals.

DETAILED DESCRIPTION

Figure 1:
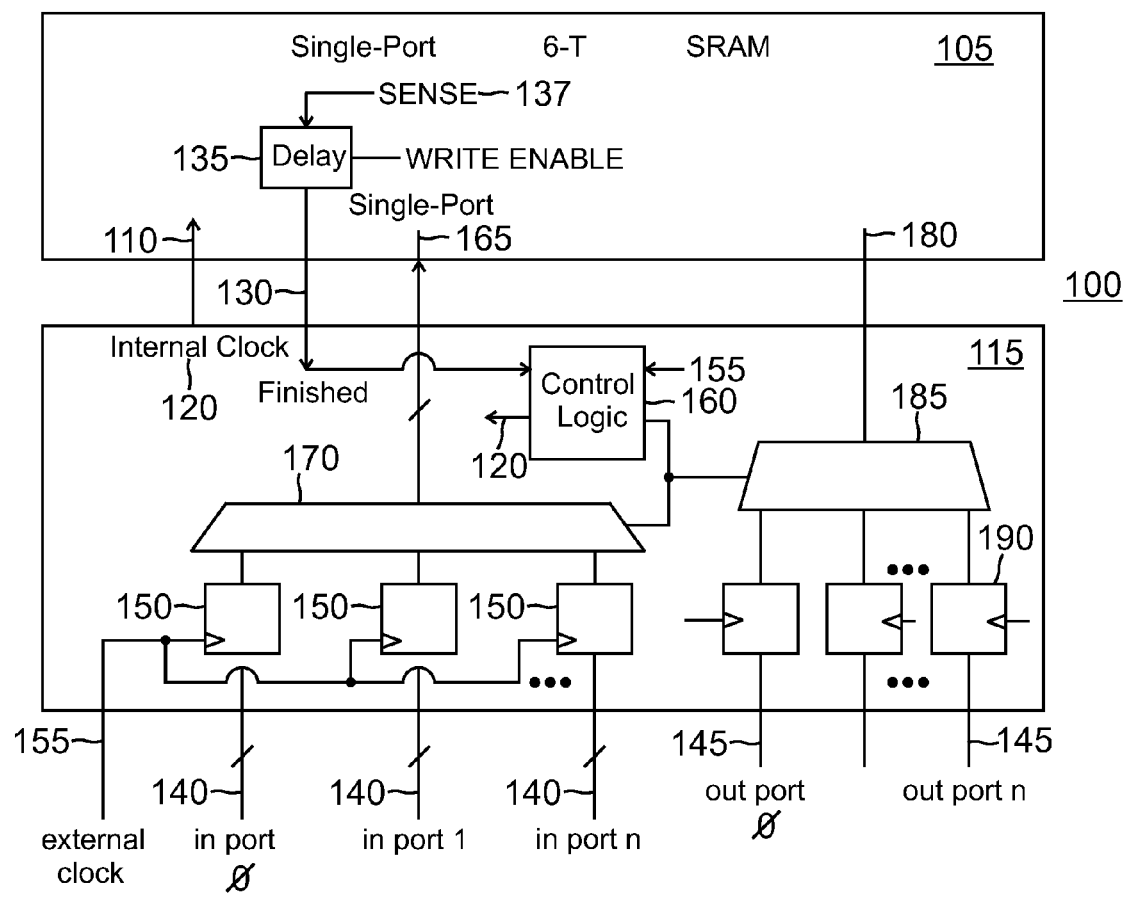
FIG. 1 is a circuit diagram of a multi-port SRAM that includes a multi-port control block circuit that interfaces to a single-port SRAM.

To provide a multi-port SRAM having increased density, a single-port SRAM interfaces with external circuitry through a multi-port control block circuit. The multi-port control block presents multiple input and output ports to the external world. A block diagram of an example six-transistor (6-T) multi-port SRAM 100 is illustrated in FIG. 1. A single-port SRAM 105 includes an array of conventional 6-T memory cells as known in the SRAM arts. As is also customary in the SRAM arts, SRAM 105 performs read and write operations responsive to a clock signal 110. However, SRAM 105 receives clock signal 110 from a multi-port control block circuit 115 which generates this clock signal as an internal clock 120. Unlike conventional SRAMs, SRAM 105 generates a finish signal 130 that indicates when write operations and read operations are successfully finished. For example, it is conventional for an SRAM to generate a sense command that indicates when a sense amplifier should make a bit decision during a read operation. SRAM 105 may include a delay circuit 135 that provides an adequate delay after a sense command 137 has been asserted. Similarly, delay circuit 135 will also provide a suitable delay after a write enable signal 140 is asserted during a write operation. Alternatively, separate delay circuits for the respective signals 137 and 140 may be provided. It will be appreciated that SRAM 105 is thus generating the finished signal in an asynchronous hand-shaking fashion with respect to the triggering by internal clock 120. Commonly-assigned U.S. application Ser. No. 12/031,504, the contents of which are incorporated by reference in their entirety, discloses a 6-T SRAM in one embodiment that operates in such an asynchronous fashion. This SRAM performs its read and write operations responsive to a triggering clock edge such as that provided by internal clock 120. However, internal SRAM clock 110 is reset independently from internal clock 120 depending upon when the read and write operations are finished. Such a reset may be used in place of delay circuit 135 to generate the finish signal.

Multi-port SRAM 100 includes an arbitrary number n of input ports 140. Similarly, multi-port SRAM 100 includes the same number n of output ports 145. Input signals provided on input ports 140 are registered in registers 150 responsive to a clock edge in an external clock 155. Thus, after an appropriate clock edge (for example, a rising clock edge) in external clock 155, the various input signals provided to the input ports are latched into multi-port control block circuit 115. This block circuit includes a dedicated control logic circuit 160 that includes the logic to sequentially provide the various input signals to a single input port 165 for 6-T SRAM 105. For example, block circuit 115 may include an n:1 input multiplexer 170 that receives the latched input signals from input ports 140 that is sequentially controlled by logic 160 to provide the various input signals in a serial fashion to single input port 165. Control logic 160 is thus responsive to external clock 155 so as to begin a write operation. Control logic 160 may then generate internal clock 120 with a suitable delay such that the various input signals are settled in registers 150 and ready to be multiplexed out to 6-T SRAM 105. Control logic 160 may command input multiplexer 170 to select for the input signals in fixed serial order or in an adaptive order responsive to priorities assigned to the various input signals. For example, a fixed serial order could be just the numerical order of the input ports such that input multiplexer 170 selects initially for the input signal corresponding to an input port 0, then for the input signal corresponding to an input signal corresponding to an input port 1, and so on until the final input signal corresponding to an input port n is selected.

Regardless of whether a fixed or adaptive serial order is used by multiplexer 170, control logic 160 should control the delay between successive selections by multiplexer 170 such that 6-T SRAM 105 has finished its read or write operation. Thus, control logic 165 is responsive to finished signal 130. Control logic 160 does not de-assert internal clock 120 until finished signal 130 is asserted by 6-T SRAM 105. Control logic 160 may then command multiplexer 170 to select for the successive input signal. After a suitable delay, control logic 160 may then re-assert internal clock to repeat a write operation.

Read operations occurs analogously for SRAM 100 in that output signals from a single output port 180 for 6-T SRAM 105 are demultiplexed through a 1:n output de-multiplexer 185 so that the various output signals may be sequentially registered in output registers 190. Each successive selection by de-multiplexer 185 is controlled by control logic 160 responsive to finish signal 130.

Figure 2:
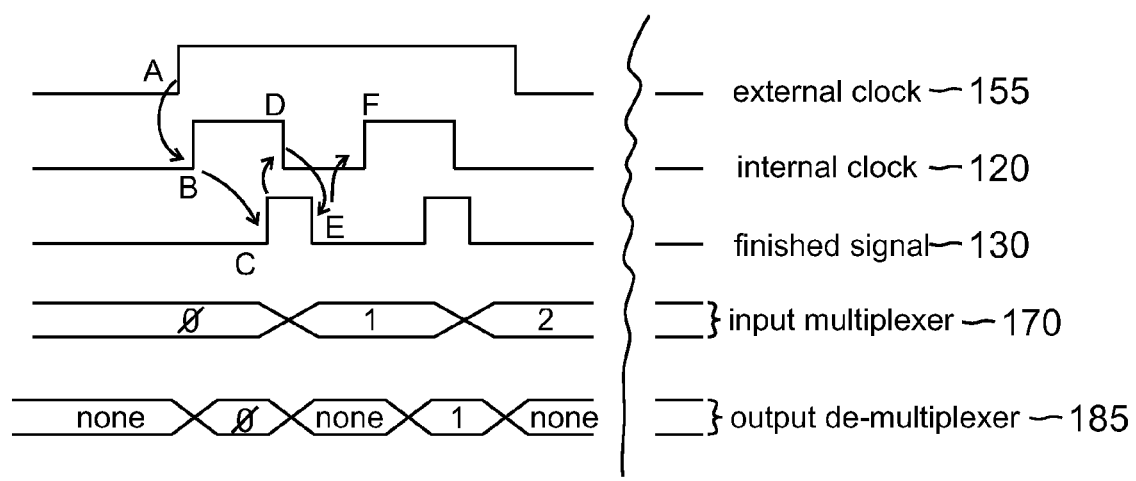
FIG. 2 is a timing diagram for various signals and components within the multi-port SRAM of FIG. 1.

The resulting time relationship of external clock 155, internal clock 120, finished signal 130, selection by input multiplexer 170, and selection by output de-multiplexer 185 is illustrated in FIG. 2. A read operation (or write operation) begins with the assertion of external clock 155 at time A. After a suitable delay to allow for registration of any input signals, the assertion of the external clock triggers an assertion of the internal clock 120 at time B. Subsequent to the assertion of internal clock 120, 6-T SRAM 105 of FIG. 1 performs either a read or write operation. The completion of this operation triggers the assertion of finished signal 130 at time C. The assertion of finished signal 130 then triggers the release of internal clock 120 at time D. Should a read operation be taking place, the assertion of finish signal 130 also triggers output de-multiplexer 185 to select for an appropriate output port such as output port 0.

It will be appreciated that if 6-T SRAM 105 is operating near its maximum frequency, the validity of an output signal at its output port 180 may be relatively short responsive to the assertion of finished signal 130. Thus, control logic 160 will trigger output registers 190 to latch their output signals with a short pulse that is within the validity time window. The input signals may be registered, latched, or buffered such that multi-port embodiments may vary accordingly from that shown in FIG. 1. In the embodiment of FIG. 2, output de-multiplexer 185 selects for output port 0 after the assertion of finish signal 130 at time C. In a write operation, input multiplexer 170 selects for an initial input port such as input port 0 prior to the assertion of the external clock. After the de-assertion of the finished signal, input multiplexer 170 will then select for a subsequent input port such as input port 1, and so on. After finished signal 130 is de-asserted at time E, control logic 160 will wait a sufficient time such as to allow the output registers to settle and re-assert internal clock 160 at time F to begin another internal read or write cycle. In this fashion, SRAM 100 will proceed from one port to a subsequent port until all the ports (either input or output depending upon whether a write or read operation is occurring) have had a chance to access the memory—it is allowable that a port may perform no operation in that a user did not command any corresponding input or corresponding output. Having completed all the ports, SRAM 100 will reset multiplexer 170 to an initial input port (such as input port 0) and wait for the next assertion of external clock 155. Should external clock 155 be asserted but no read or write operation be commanded with regard to the input/output ports, control logic 160 will detect such a null operation and keep 6-T SRAM 105 idle.

The advantages of such a multi-port SRAM are numerous. For example, since the 6-T multi-port SRAM 105 is significantly smaller than a traditional 8-T multi-port SRAM, power consumption is minimized and performance is optimized. Furthermore, a 6-T multi-port SRAM allows for multi-port SRAMs of sizes that are not practical with larger cells.

Another advantage relates to inherent collision handling and priority encoding. Rather than having undefined behavior if several ports are trying to access the same address during the same cycle, SRAM 100 has a very clear priority encoding and collision handling mechanism implemented in control logic 160. The ports are accessed in a sequential order that the user can depend on and tailor to his specific needs. For instance, if it is desired that one port take priority in the event that several ports write to the same address on the same cycle, that port can be made to execute last. A more complex priority handler can also be implemented, if desired.

Another advantage relates to the generation of internal clock 120, which is based on when SRAM 100 has finished a previous input port/output port processing rather than though a division of external clock 155. In addition, using an internal clock that is independent from the external clock has numerous advantages. For example, the internal clock is generated based on when SRAM 105 finishes the previous operation, rather than relying on the external clock. This makes the memory impervious to the duty cycle of the external clock, and completely independent of any clock jitter or other timing problems of the external clock. Similarly, the access times for all the ports' outputs are completely independent of any issues from the external clock's duty cycle or falling edge jitter.

Another advantage relates to the internal handshaking between the finished signal and the assertion of the internal clock. With such internal handshaking, a port is accessed as soon as the previous port is finished, making access and cycle times of the memory as fast as possible. The internal clock is always operating near the maximum operating frequency of SRAM 105, allowing for either faster access or cycle times. Such handshaking also enables the option to add more ports within a given cycle time.

Yet another advantage relates to the ease of port customization. To add more ports to SRAM 100, all that is required are more input registers and output registers. Control logic 160 would then be configured to generate additional corresponding internal clock cycles. Such a port customization is simple to implement and takes up minimal area, therefore the growth in overall die demand is negligible.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A multi-port 6-Transistor (6-T) SRAM, comprising:
a single input port and output port 6-T SRAM; and
a multi-port control block circuit that includes:
 a plurality of input registers corresponding to a plurality of input ports to register corresponding input signals;
 an input multiplexer coupled to the input registers to provide a selected input signal to the 6-T SRAM's single input port;
 a plurality of output registers corresponding to a plurality of output ports to register corresponding output signals; and
 an output de-multiplexer coupled to the output registers to provide an output signal from the 6-T SRAM's single output port to the selected output register.

2. The multi-port 6-T SRAM of claim 1, wherein the 6-T SRAM is configured to initiate a read or write cycle responsive to the assertion of an internal clock and includes a delay circuit configured to assert a finish signal upon the completion of the read or write cycle.

3. The multi-port 6-T SRAM of claim 2, wherein the control block circuit includes a logic circuit configured to initiate the read or write cycle responsive to the assertion of the external clock.

4. The multi-port 6-T SRAM of claim 3, wherein the logic circuit is further configured to control the input multiplexer to sequentially select from the input registers during the write cycle and to control the output de-multiplexer to sequentially select from the output registers during the read cycle.

5. The multi-port 6-T SRAM of claim 3, wherein the logic circuit is further configured to control the input multiplexer to non-sequentially select from the input registers during the write cycle and to control the output de-multiplexer to non-sequentially select from the output registers during the read cycle.

6. The multi-port 6-T SRAM of claim 3, wherein the logic circuit is configured to de-assert the internal clock responsive to an assertion of the finish signal.

7. A method of writing to a single-port 6-T SRAM through a multi-port control circuit, the multi-port control circuit including a plurality n of input ports; comprising:
asserting an external clock indicating the beginning of a write cycle while receiving a plurality n of input in parallel at the plurality of input ports;
storing the plurality of input words in a storage responsive to the assertion of the external clock;
selecting a first input word from the storage to provide the first input word to the SRAM while asserting an internal clock to the SRAM to initiate an internal write cycle in the SRAM;
asserting a finish signal indicating that the internal write cycle is completed;
de-asserting the internal clock responsive to the assertion of the finish signal; and
de-asserting the finish signal responsive to the de-assertion of the internal clock.

8. The method of claim 7, further comprising:
selecting a subsequent input word from the storage to provide the subsequent input word to the SRAM while re-asserting the internal clock to initiate an additional internal write cycle in the SRAM;
re-asserting the finish signal indicating that the additional internal write cycle is completed;
de-asserting the internal clock responsive to the re-assertion of the finish signal; and
de-asserting the finish signal responsive to the de-assertion of the internal clock.

9. The method of claim 8, comprising:
continuing to initiate additional internal write cycles until all n input words are written to the SRAM, wherein the finish signal is asserted after completion of each internal write cycle.

10. The method of claim 8, wherein the selection of the input words from the storage occurs through a multiplexer.

11. The method of claim 8, wherein the storage comprises a plurality of registers.

12. The method of claim 8, wherein the storage comprises a plurality of latches.

13. The method of claim 8, wherein the storage comprises a buffer.

14. A method of reading from a single-port 6-T SRAM through a multi-port control circuit, the multi-port control circuit including a plurality n of output ports; comprising:
asserting an external clock indicating the beginning of a read cycle;
asserting an internal clock to the SRAM responsive to the assertion of the external clock to initiate a first internal read cycle to read a first output word;
asserting a finish signal upon the completion of the first internal read cycle;
demultiplexing the first output word to a first one of a plurality of n registers responsive to the assertion of the finish signal;
de-asserting the internal clock responsive to the assertion of the finish signal; and
de-asserting the finish signal responsive to the de-assertion of the internal clock.

15. The method of claim 14, further comprising:
re-asserting the internal clock to the SRAM to initiate a second internal read cycle to read a second output word;
re-asserting the finish signal upon the completion of the second internal read cycle;
demultiplexing the second output word to .a second one of the plurality of n registers responsive to the re-assertion of the finish signal;
de-asserting the internal clock responsive to the re-assertion of the finish signal; and
de-asserting the finish signal responsive to the de-assertion of the internal clock.

16. The method of claim 15, further comprising:
continuing to initiate additional internal read cycles until all n output words are written to the n registers, wherein the finish signal is asserted after completion of each internal read cycle.

* * * * *